(12) United States Patent
Choi

(10) Patent No.: US 7,335,267 B2
(45) Date of Patent: Feb. 26, 2008

(54) HEAT TREATING APPARATUS HAVING ROTATABLE HEATING UNIT

(75) Inventor: Young-Kwean Choi, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 164 days.

(21) Appl. No.: 10/741,911

(22) Filed: Dec. 19, 2003

(65) Prior Publication Data
US 2004/0132302 A1    Jul. 8, 2004

(30) Foreign Application Priority Data
Jan. 6, 2003    (KR) ................................ 2003-0592

(51) Int. Cl.
C23C 16/00    (2006.01)
C23F 1/00    (2006.01)
H01L 21/306    (2006.01)

(52) U.S. Cl. .................. 118/725; 156/345.52; 118/724; 392/416; 392/418

(58) Field of Classification Search ................ 118/724, 118/725, 728, 500; 156/345.27, 345.52, 156/345.37, 345.51; 219/50, 411; 392/415, 392/416, 418
See application file for complete search history.

(56) References Cited

U.S. PATENT DOCUMENTS

| | | | |
|---|---|---|---|
| 4,796,562 A | | 1/1989 | Brors et al. |
| 4,857,704 A | * | 8/1989 | Jannot et al. ............... 219/411 |
| 5,412,180 A | * | 5/1995 | Coombs, III ............... 219/385 |
| 5,446,825 A | | 8/1995 | Moslehi et al. |
| 5,587,019 A | * | 12/1996 | Fujie ........................... 118/725 |
| 5,719,991 A | | 2/1998 | Sandhu et al. |
| 5,830,277 A | | 11/1998 | Johnsgard et al. |
| 6,465,761 B2 | * | 10/2002 | Stevens et al. ............. 219/411 |
| 6,554,905 B1 | * | 4/2003 | Goodwin ..................... 118/724 |
| 6,707,011 B2 | * | 3/2004 | Tay et al. .................... 219/411 |
| 2001/0002948 A1 | | 6/2001 | Aschner et al. |
| 2004/0018008 A1 | * | 1/2004 | Koren et al. ................. 392/416 |

FOREIGN PATENT DOCUMENTS

| | | |
|---|---|---|
| JP | 10-189468 | 7/1998 |
| JP | 11154649 | * 6/1999 |
| JP | 2000-136961 | 5/2000 |
| JP | 2001-077037 | 3/2001 |
| JP | 2001-332507 | 11/2001 |

(Continued)

OTHER PUBLICATIONS

English Abstract of Korean Publication No. 10199300001898.
English Abstract of Korean Publication No. 10200000051930.
English Abstract of Korean Publication No. 1020010054516.
English Abstract of Korean Publication No. 1020020026344.
English Abstract of Japanese Publication No. 2001-332507.

(Continued)

Primary Examiner—Parviz Hassanzadeh
Assistant Examiner—Rakesh K. Dhingra
(74) Attorney, Agent, or Firm—Marger Johnson & McCollom, P.C.

(57) ABSTRACT

An apparatus includes a stationary supporting base for mounting a semiconductor wafer thereon, and a rotatable heating unit having a plurality of heating lamps located above the wafer. The stationary supporting base is fixed and the rotatable heating unit rotates horizontally on a rotating axis. Therefore, the uniformity of wafer heating can be improved, and the breakage or the warpage of the wafer can be prevented.

9 Claims, 6 Drawing Sheets

FOREIGN PATENT DOCUMENTS

| | | |
|---|---|---|
| KR | 10199300001898 | 3/1993 |
| KR | 1998-016834 | 6/1998 |
| KR | 1999-026796 | 4/1999 |
| KR | 10200000051930 | 8/2000 |
| KR | 1020010054516 | 7/2001 |
| KR | 1020020026344 | 4/2002 |

OTHER PUBLICATIONS

English Abstract of Japanese Publication No. 2000-136961.
English Abstract of Japanese Publication No. 2001-077037.
English Abstract of Korean Publication No. 1998-016834.
English Abstract of Korean Publication No. 1999-026796.
English Abstract of Japanese Publication No. 10-189468.

* cited by examiner

HEAT TREATING APPARATUS HAVING ROTATABLE HEATING UNIT

This application claims priority from Korean Patent Application No. 2003-0592, filed on Jan. 6, 2003, the contents of which are incorporated herein by reference in their entirety.

BACKGROUND OF THE INVENTION

1. Field of the Invention

The present invention relates generally to an apparatus used for treating a semiconductor wafer with heat in wafer fabrication processes, and more particularly, to an apparatus for improving the uniformity of wafer heating as well as preventing the breakage and the warpage of the wafer.

2. Description of the Related Art

In numerous processes of the wafer fabrication, a heat treatment process of the wafer is necessary to form various layers, e.g., a metal layer, a polysilicon layer and so on. One kind of the heat treatment process is performed using a furnace in which the wafer is slowly heated. On the other hand, rapid thermal processing (RTP) techniques use heating lamps such as infrared lamps to allow for rapid wafer heating.

The RTP techniques have many advantages such as a high heating rate, easier temperature control, and reduced thermal budget. Currently, the RTP techniques are used in various phases of the wafer fabrication processes including silicide anneals, implant and other dopant activation, borophosphosilicate glass (BPSG) reflow, rapid thermal nitridation, hardened oxides, reoxidation, and implant and diffusion monitors.

In general, The RTP apparatus is composed of a supporting base for supporting the wafer mounted thereon, and a heating unit having several heating lamps for heating the wafer. Two examples of the conventional RTP apparatus are respectively shown in FIGS. 1 and 2.

Referring to FIG. 1, a semiconductor wafer 10 is mounted on a supporting base 101. A heating unit 105 has a plurality of stick-type infrared lamps 109 to apply heat to the wafer 10. The stick-type infrared lamps 109 are arranged at regular intervals over and under the wafer 10. However, with this arrangement of the infrared lamps 109, it is not easy to heat the wafer 10 in a uniform manner.

Referring to FIG. 2, the wafer 10 is mounted on a rotatable supporting base 103, which rotates horizontally on an axis. A heating unit 106 has a plurality of bulb-type infrared lamps 111 to apply heat to the wafer 10. The heating unit 106 is located above the wafer 10, and the bulb-type infrared lamps 111 are arranged densely at the bottom of the heating unit 106. This arrangement of the infrared lamps 111 serves to increase the uniformity of wafer heating. However, the rotation of the wafer 10 causes the breakage of the wafer 10, e.g., a crack at edges of the wafer 10, and the warpage of the wafer 10.

Accordingly, there is an immediate need for a heat-treating apparatus that not only improves the uniformity of wafer heating but also prevents the breakage and the warpage of the wafer.

SUMMARY OF THE INVENTION

According to one embodiment of the present invention, an apparatus comprises a stationary supporting base for mounting a semiconductor wafer thereon. The apparatus further comprises a rotatable heating unit having a plurality of heating lamps located above the wafer and constructed to rotate horizontally on a rotating axis.

BRIEF DESCRIPTION OF THE DRAWINGS

The features and advantages of the present invention will become more apparent by describing embodiments thereof with reference to the attached drawings in which.

DETAILED DESCRIPTION

The present invention will now be described more fully hereinafter with reference to the accompanying drawings, in which a preferred embodiment of the invention is shown. This invention may, however, be embodied in many different forms and should not be construed as limited to the embodiment set forth herein. Rather, this embodiment is provided so that this disclosure will be thorough and complete, and will fully convey the scope of the invention to those skilled in the art.

In the description, well-known structures such as a chamber have not been shown in detail to avoid obscuring the present invention. It will be appreciated that some elements illustrated in the figures have not necessarily been drawn to scale for simplicity and clarity of illustration. For example, the dimensions of some of the elements are exaggerated relative to other elements. Like numerals are used for like and corresponding parts throughout the drawings.

Figure 1:
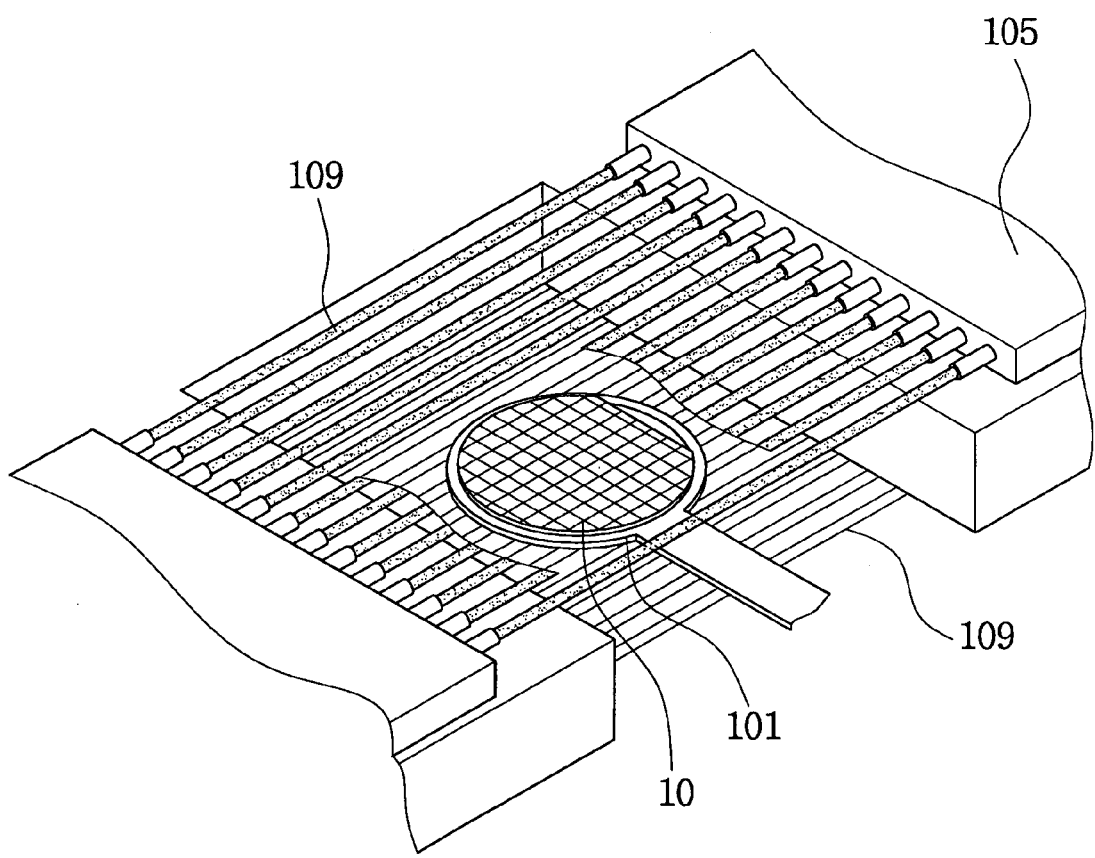
FIG. 1 is a perspective view schematically showing a conventional RTP apparatus.
Figure 2:
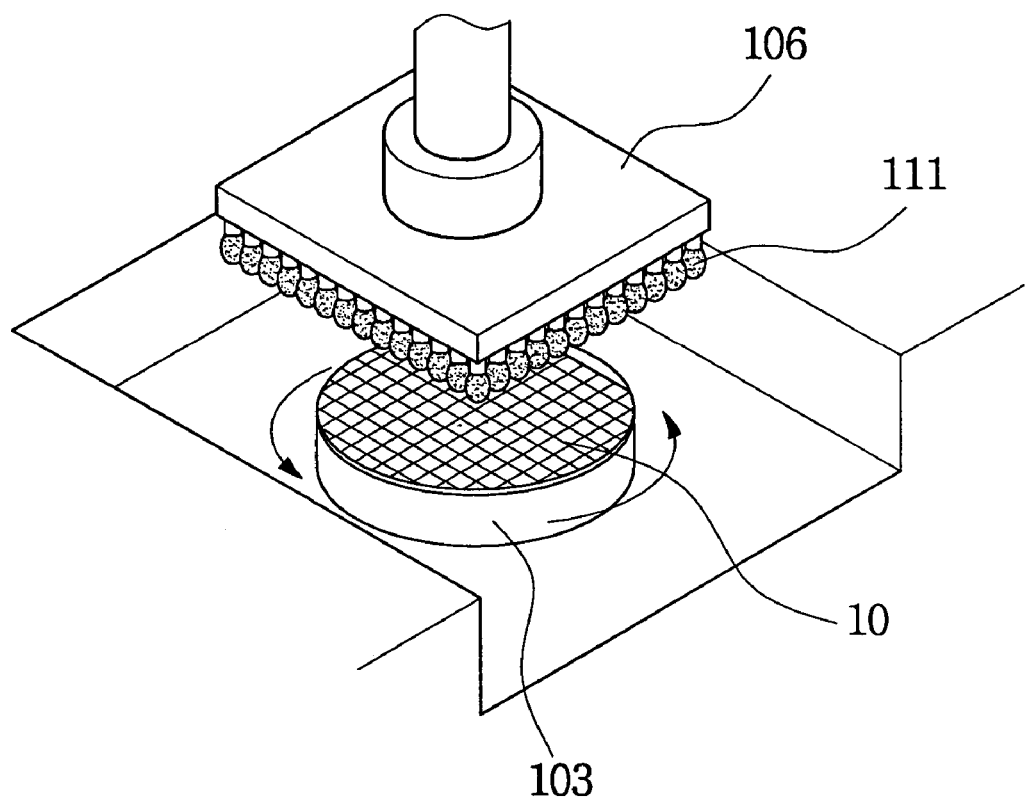
FIG. 2 is a perspective view schematically showing another conventional RTP apparatus.
Figure 3:
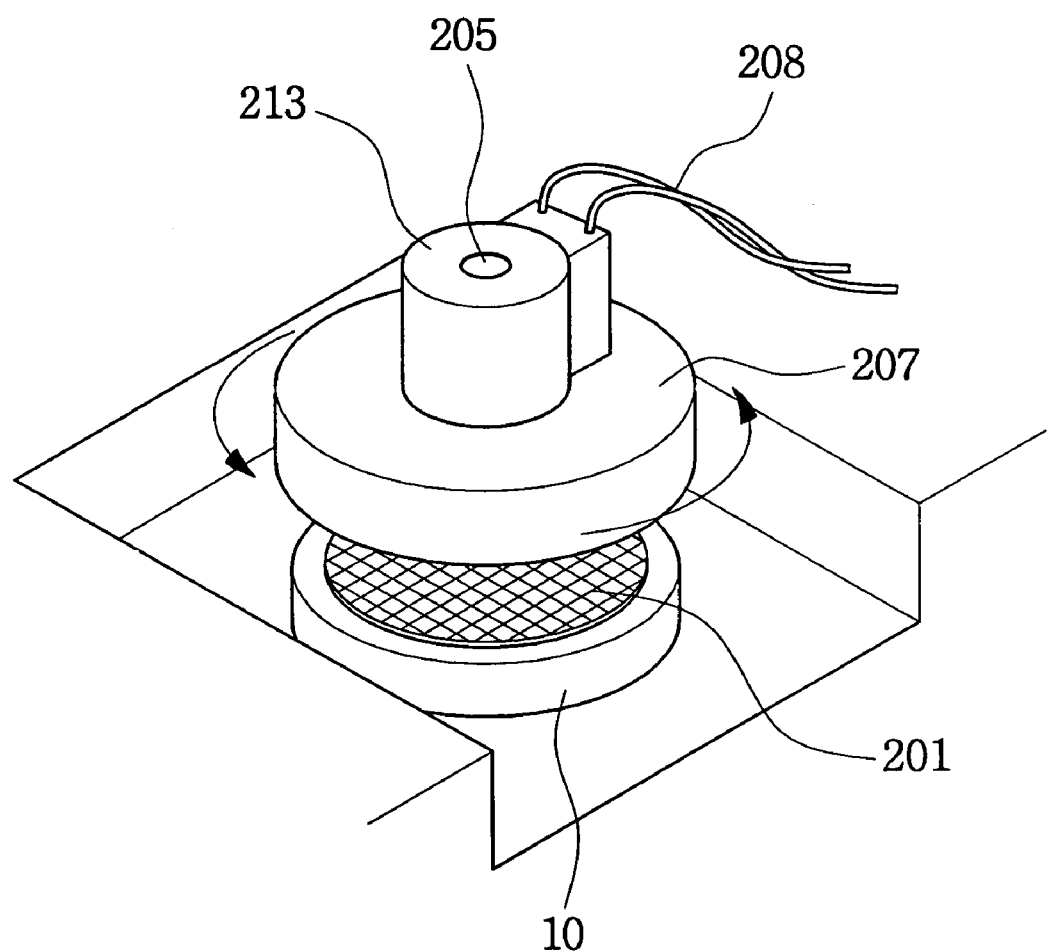
FIG. 3 is a perspective view schematically showing an RTP apparatus having a rotatable heating unit in accordance with one embodiment of the present invention.

FIG. 3 schematically shows, in a perspective view, a rapid thermal processing (RTP) apparatus having a rotatble heating unit in accordance with an embodiment of the present invention. Referring to FIG. 3, a semiconductor wafer 10 is mounted on a stationary supporting base 201 for a heat treatment process. A heating unit 207 is located above the wafer 10 and rotates horizontally on a rotating axis 205 by a driving member 213. The driving member 213 can be any device or mechanism, such as a motor, suitable for implementing the present invention as is known to one skilled in the art. The rotatable heating unit 207 has a plurality of heating lamps 203, which are shown in FIG. 4.

Figure 4:
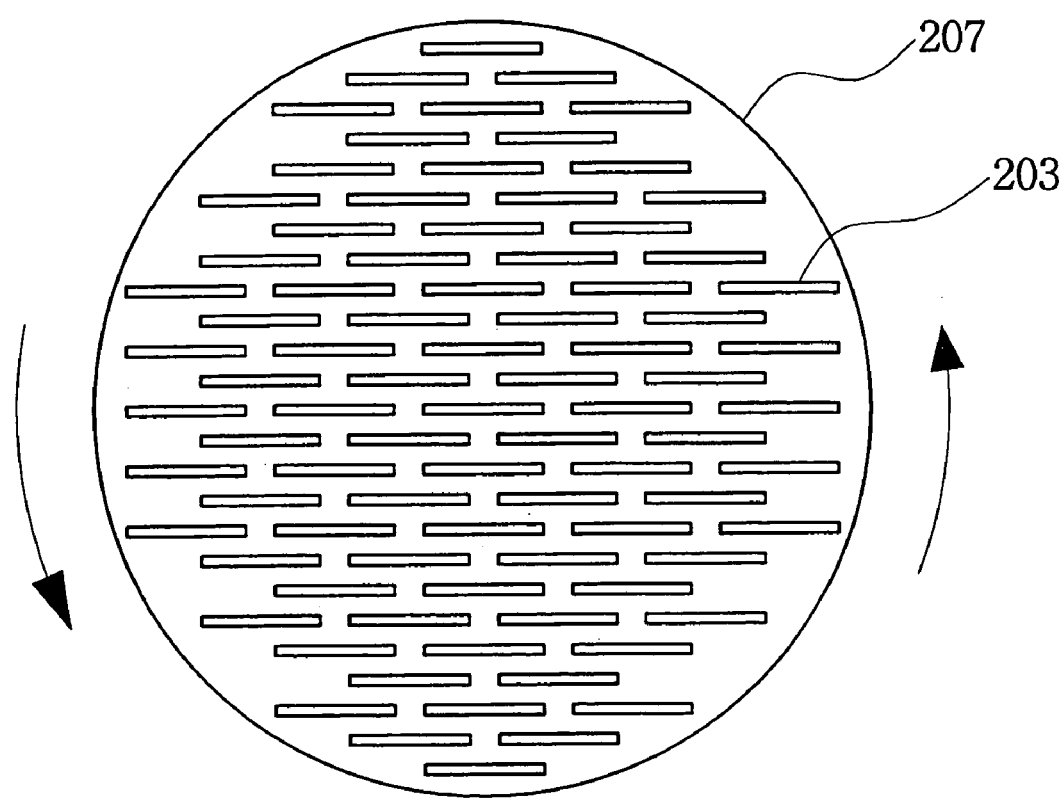
FIG. 4 is a bottom plan view schematically showing the arrangement of heating lamps of the RTP apparatus shown in FIG. 3.

As depicted in FIG. 4, the plurality of heating lamps 203 may be formed on a bottom surface of the rotatable heating unit 207. In particular, the heating lamps 203 may be arranged in several rows, each having one or more lamps 203. Further, the rows of the heating lamps 203 may be disposed in parallel with each other and slightly apart from each other.

Preferably, the lamps 203 in the row are diagonally offset from those of both adjacent rows so that radiating regions of heat can be overlapped. The heating lamp 203 may be a small-sized and stick-type infrared lamp, but other types are also possible. Since the heating unit 207 is a rotating type, the supply of power in the RTP apparatus may be achieved by so-called a brush collecting method shown in FIG. 5. One skilled in the art will appreciate that other suitable methods can be used to supply the electrical power in the RTP apparatus.

Figure 5:
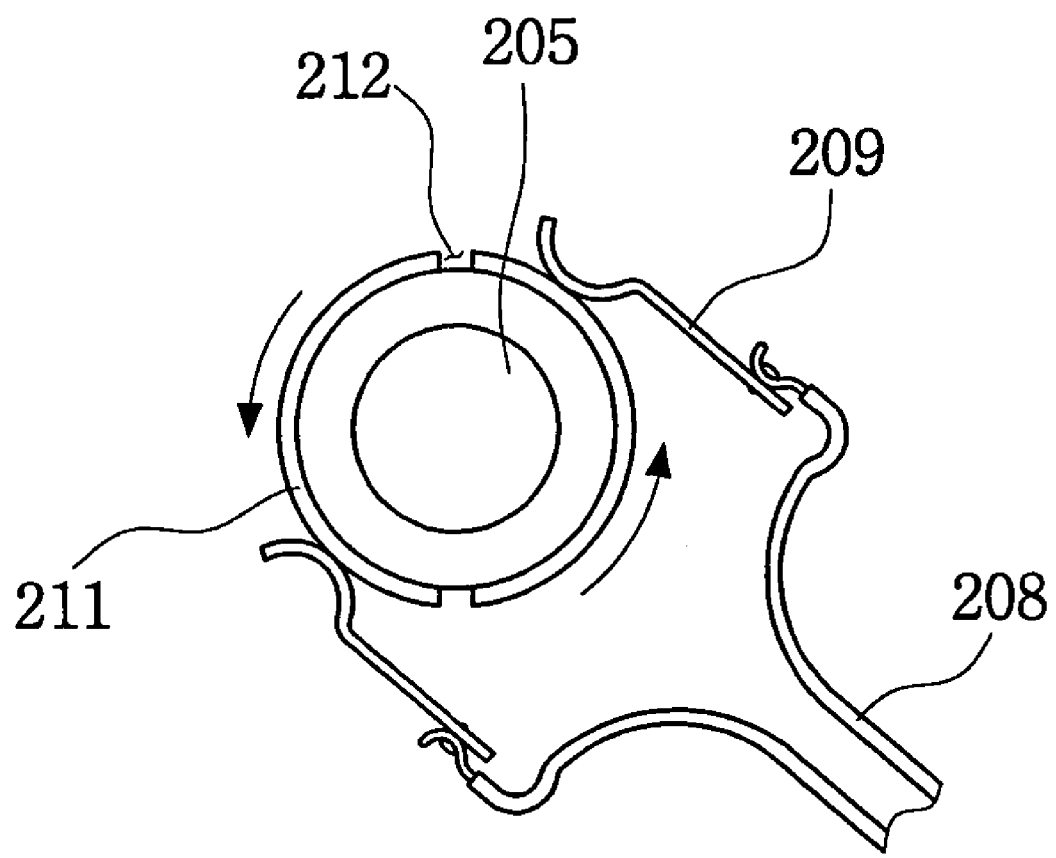
FIG. 5 is a view schematically showing a way to supply power for the RTP apparatus shown in FIG. 3.

Referring to FIG. 5, power supply lines 208 are electrically connected to brushes 209, which is in contact with a slip ring 211 formed around the rotating axis 205 of the heating unit 207. The slip ring 211 has two or more segments which are divided to leave gaps 212 and alternatively touched to the brushes 209 with different polarity by rotation. The brush 209 and the slip ring 211 may have various shapes and structures instead of an example shown in FIG. 5.

Figure 6:
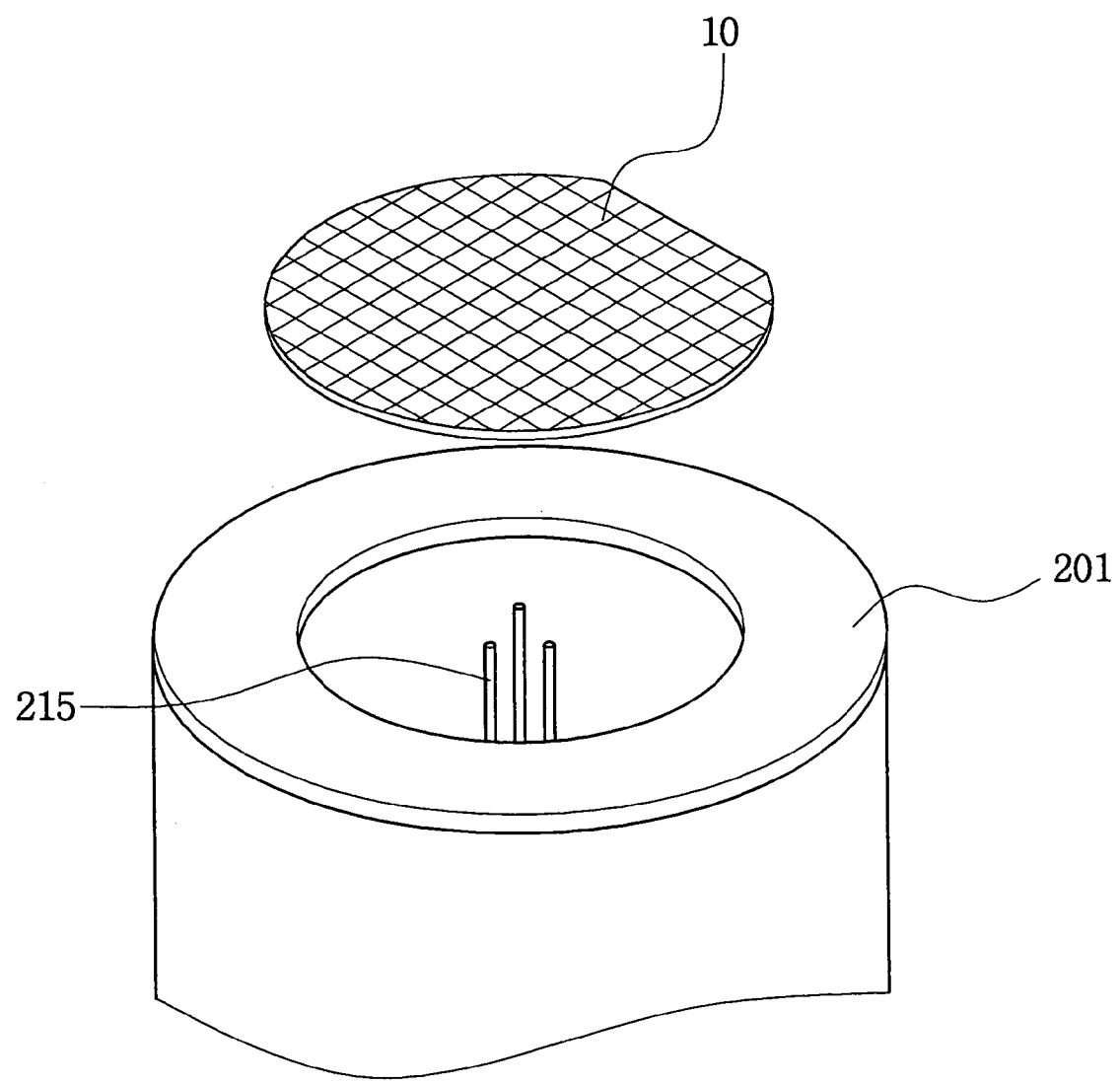
FIG. 6 is a perspective view schematically showing a stationary supporting base of the RTP apparatus shown in FIG. 3.

As illustrated in FIG. 6, the stationary supporting base 201 of the RTP apparatus is an edge ring with a vacant circular center in which a pyrometer 215 is formed to measure a temperature of the wafer 10. Instead of the edge ring 201, a wafer table and other equivalent structures may be used as a supporting base.

Another embodiment of the invention is a method for heat treating a semiconductor wafer. The method includes positioning a semiconductor wafer on a supporting base. A rotatable heating unit is then positioned above the wafer. Electrical power is supplied to the heating unit and the heating unit is horizontally rotated to provide uniform heating of the wafer.

To allow for the rotation of the heating unit, electrical power may be supplied to the heating unit by a brush collecting method as shown in FIG. 5.

The rotatable heating unit may include a plurality of heating lamps. The lamps may be arranged in several rows where the rows are parallel with each other and the rows are positioned slightly apart for each other. The heating lamps in a row can be positioned diagonally offset from the heating lamps that are located in both adjacent rows.

As described above, the RTP apparatus of the present invention has the stationary supporting base 201 and the rotatable heating unit 207. Since the wafer 10 does not move on the stationary supporting base 201, the breakage such as crack or the warpage of the wafer can be prevented during and after the heat treatment process. Additionally, since the heating unit 207 rotates over the wafer 10 during the heat treatment, the uniformity of wafer heating can be improved.

In the drawings and specification, there has been disclosed a preferred embodiment of the invention and, although specific terms are employed, they are used in a generic and descriptive sense only and not for purposes of limitation, the scope of the invention being set forth in the following claims. For example, the present invention is described in connection with an RTP device. However, the present invention is not limited to this, but can also be applied to other suitable heat treating apparatus within the spirit and scope of the present invention.

What is claimed is:

1. An apparatus comprising:
   a supporting base for mounting a semiconductor wafer thereon; and
   a heating unit having a plurality of stick-shape heating lamps located above the supporting base,
   wherein:
   the heating lamps are arranged in a plurality of rows such that the rows are disposed in parallel with each other and apart from each other and such that heating lamps within a row have a common longitudinal axis;
   in each row, the heating lamps of the row are spaced such that each heating lamp substantially overlaps with at least two heating lamps of an adjacent row; and
   in each row, for any pair of adjacent heating lamps, the heating lamps of the pair are disposed such that an end of one heating lamp of the pair faces an end of the other heating lamp of the pair.

2. The apparatus of claim 1, wherein the heating unit is electrically connected to power supply lines by a brush collecting method.

3. The apparatus of claim 1, wherein the supporting base includes an edge ring with a vacant circular center.

4. The apparatus of claim 1, wherein:
   the stick-shape heating lamps are arranged in a plurality of rows such that the rows are disposed in parallel with each other and apart from each other and such that stick-shape heating lamps within a row have a common longitudinal axis;
   in each row, the stick-shape heating lamps of the row are spaced such that each stick-shape heating lamp substantially overlaps with at least one stick-shape heating lamp of an adjacent row; and
   in each row, for any pair of adjacent stick-shape heating lamps, the stick-shape heating lamps of the pair are disposed such that an end of one stick-shape heating lamp of the pair faces an end of the other stick-shape heating lamp of the pair.

5. The apparatus of claim 1, wherein the plurality of stick-shape heating lamps are infrared lamps.

6. The apparatus of claim 1, wherein the heating unit is rotatable with respect to the supporting base.

7. The apparatus of claim 6, wherein the heating unit is constructed to rotate horizontally.

8. The apparatus of claim 1, wherein the supporting base is a stationary supporting base.

9. The apparatus of claim 1, wherein the heating unit comprises a first surface and a second surface opposite the first surface and wherein the plurality of heating lamps are located on the second surface of the heating unit.

* * * * *